(12) United States Patent
Hsiao et al.

(10) Patent No.: US 12,506,068 B2
(45) Date of Patent: Dec. 23, 2025

(54) SEMICONDUCTOR STRUCTURE WITH RESISTOR AND CAPACITOR

(71) Applicant: Taiwan Semiconductor Manufacturing Company, Ltd., Hsinchu (TW)

(72) Inventors: Ru-Shang Hsiao, Jhubei (TW); Po-Ying Chen, Tainan (TW); Chen-Bin Lin, Tainan (TW); Jie Jay Sun, Hsinchu (TW); I-Shan Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 374 days.

(21) Appl. No.: 17/814,124

(22) Filed: Jul. 21, 2022

(65) Prior Publication Data
US 2023/0335488 A1    Oct. 19, 2023

Related U.S. Application Data

(60) Provisional application No. 63/331,373, filed on Apr. 15, 2022.

(51) Int. Cl.
*H01L 23/522* (2006.01)
*H01L 21/768* (2006.01)
(Continued)

(52) U.S. Cl.
CPC .... *H01L 23/5228* (2013.01); *H01L 21/76832* (2013.01); *H01L 23/5223* (2013.01); *H01L 23/5283* (2013.01); *H01L 23/53266* (2013.01); *H01L 23/53295* (2013.01); *H10D 1/474* (2025.01); *H10D 1/692* (2025.01); *H01L 23/5226* (2013.01)

(58) Field of Classification Search
CPC ............. H01L 23/5228; H01L 23/5223; H01L 23/5226; H01L 23/5283; H01L 23/53266; H01L 23/53295; H01L 21/76832; H01L 28/24; H01L 28/60; H10D 1/692; H10D 1/474
USPC ....................................................... 257/533
See application file for complete search history.

(56) References Cited

U.S. PATENT DOCUMENTS 10,541,274 B2 *   1/2020   Yi .......................... H10B 63/80
11,715,755 B2     8/2023   Chen et al.
(Continued)

FOREIGN PATENT DOCUMENTS

DE     102020119947 A1    12/2021
KR     1020190054962 A     5/2019

*Primary Examiner* — Tu-Tu V Ho
(74) *Attorney, Agent, or Firm* — Sterne, Kessler, Goldstein & Fox P.L.L.C.

(57) ABSTRACT

The present disclosure discloses a structure and a method directed to a semiconductor structure having a resistor structure and a metal-insulator-metal (MIM) capacitor structure formed by a single mask process. The semiconductor structure includes an interconnect structure on a substrate, a first insulating layer on the interconnect structure, first and second conductive plates on the first insulating layer and separated by a second insulating layer, a dielectric layer on the first conductive plate, and a third conductive plate on the dielectric layer. Bottom surfaces of the first and second conductive plates are coplanar.

20 Claims, 17 Drawing Sheets

(51) Int. Cl.
*H01L 23/528* (2006.01)
*H01L 23/532* (2006.01)
*H10D 1/47* (2025.01)
*H10D 1/68* (2025.01)

(56) References Cited

U.S. PATENT DOCUMENTS

| | | |
|---|---|---|
| 2003/0017699 A1* | 1/2003 | Zurcher .............. H01L 27/0688 |
| | | 257/E21.582 |
| 2008/0153245 A1 | 6/2008 | Lin et al. |
| 2018/0226453 A1 | 8/2018 | Yi |
| 2019/0148370 A1 | 5/2019 | Hung et al. |
| 2021/0020739 A1 | 1/2021 | Yeong et al. |
| 2023/0351970 A1* | 11/2023 | Lu ........................ G09G 3/3266 |

* cited by examiner

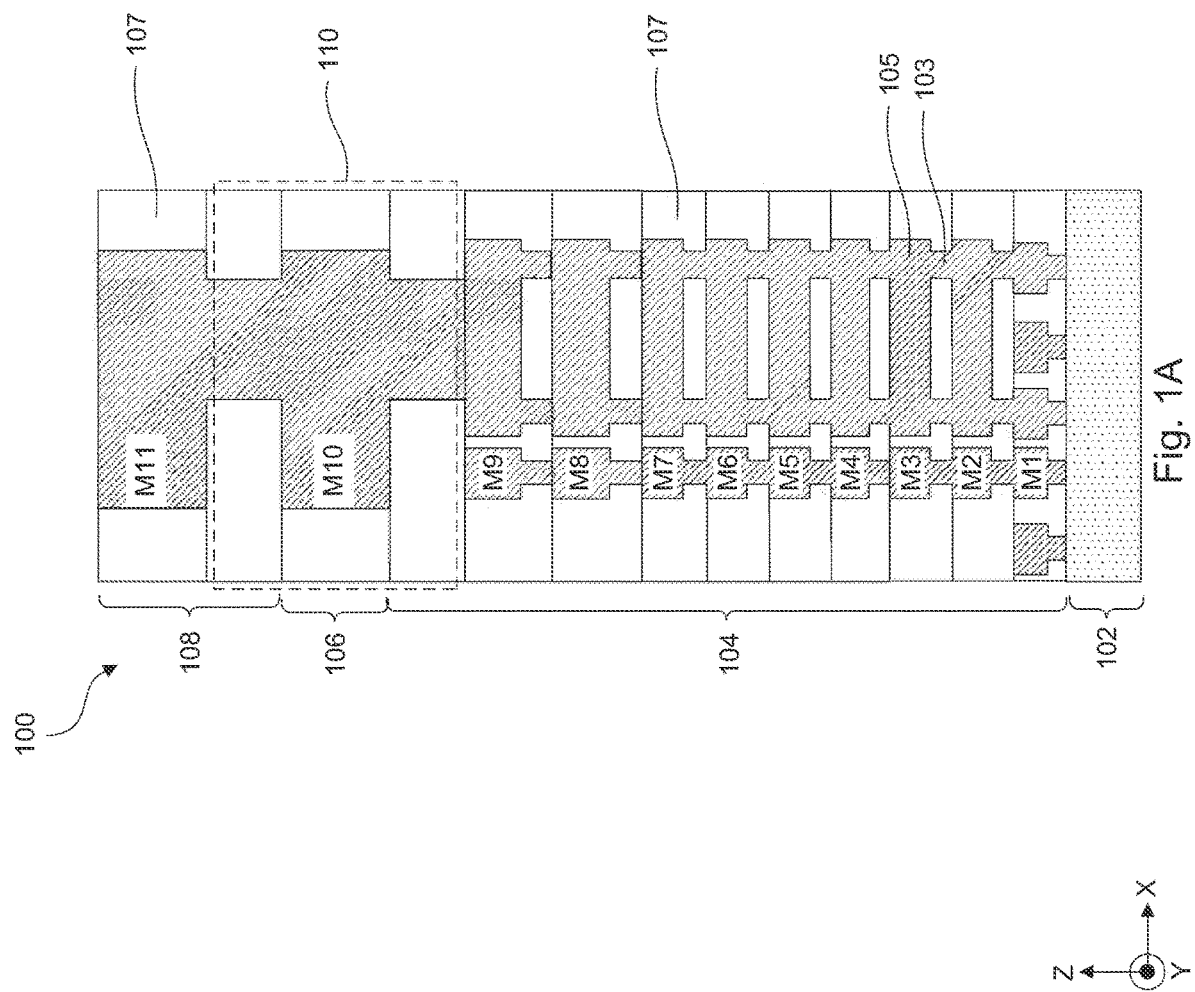

SEMICONDUCTOR STRUCTURE WITH RESISTOR AND CAPACITOR

CROSS-REFERENCE TO RELATED APPLICATION

This application claims the benefit of U.S. Provisional Patent Application No. 63/331,373, titled "High-R/Low-R Resistor Compatible with MIM Process," which was filed on Apr. 15, 2022 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. The continuous development of IC industry requires improving the integration process of the circuit elements, such as the resistor structures and the metal-insulator-metal (MIM) capacitor structures.

BRIEF DESCRIPTION OF THE DRAWINGS

Aspects of the present disclosure are best understood from the following detailed description when read with the accompanying figures.

FIG. 1A illustrates a cross-sectional view of a semiconductor structure having a resistor structure and a metal-insulator-metal (MIM) capacitor structure, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
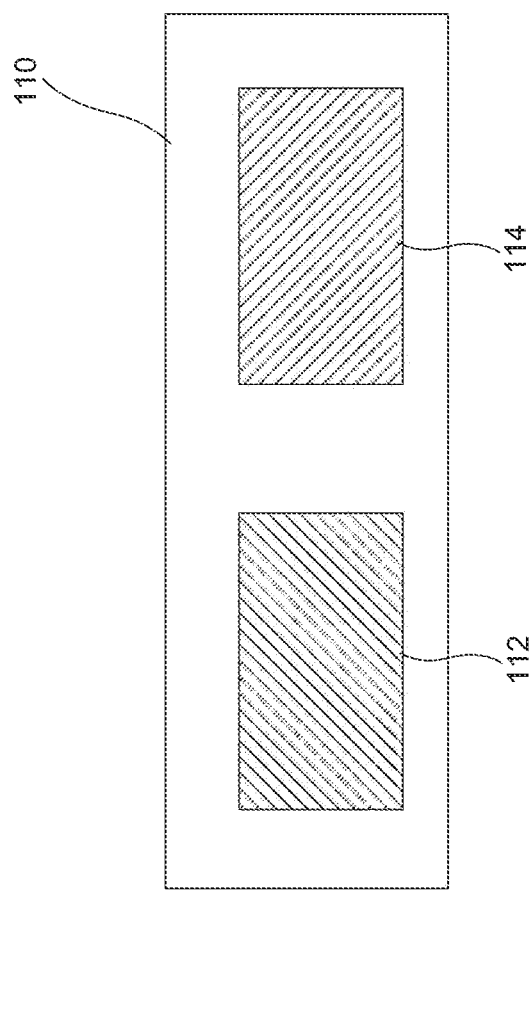
FIG. 1B illustrates a mask of a semiconductor structure having a resistor structure and a metal-insulator-metal (MIM) capacitor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

In some embodiments, the term "FEOL portion" can refer to a portion of an integrated circuit (IC) structure that have structures (e.g., active devices, passive devices, source/drain contact structures, gate contact structures, etc.) fabricated on a wafer in the front end-of-line (FEOL) stage of IC fabrication.

In some embodiments, the term "BEOL portion" can refer to a portion of an IC structure that have high-level interconnect structures (e.g., metal lines, vias, etc.) fabricated on the FEOL portion in the back end-of-line (BEOL) stage of IC fabrication.

Resistors and capacitors are elements used in semiconductor ICs for conducting an electrical current and storing an electrical charge. The resistors can be formed with a conductive plate or conductive line. Low resistance resistors (e.g., from about 1Ω to about 1 KΩ) can be used in analog and radio-frequency (RF) circuits. High resistance resistors (e.g., from about 1 KΩ to about 1 MΩ) can be used in voltage divider circuits. One type of capacitor is a metal-insulator-metal (MIM) capacitor. The MIM capacitor can be formed with two conductive capacitor plates in parallel with a dielectric layer sandwiched there between. Capacitors can be used in, for example, filters, analog-to-digital converters, memory devices, control applications, and many other types of devices in ICs.

In an IC fabrication process, resistors and capacitors are formed on a substrate using different processes to manufacture each type of device. For example, separate mask processes can be used to form the resistors and capacitors. The resistors (e.g., high and low resistance resistors) can be formed closer to the substrate in a first mask process before the formation of interconnect structures, while the capacitors can be formed further from the substrate in a second mask process after the formation of the interconnect structures. The proximity of the resistors from the substrate can generate parasitic capacitances, which can degrade high-frequency signal characteristics of the semiconductor integrated circuits. Additionally, separate masks for the resistors and capacitors can increase the manufacturing cost of the IC fabrication process.

Various embodiments in accordance with this disclosure provide methods of forming a semiconductor structure having a resistor structure and a MIM capacitor structure with a single mask process. In some embodiments, a semiconductor structure can include an interconnect structure on a substrate, a first insulating layer on the interconnect structure, and a resistor structure and a MIM capacitor structure on the first insulating layer. In some embodiments, the resistor and MIM capacitor structures can be in contact with the first insulating layer and separated by a second insulating layer. The interconnect structure can be a BEOL interconnect structure, which can be electrically connected to one or more active devices (e.g., transistors) in a FEOL device layer. In some embodiments, the resistor structure and the MIM capacitor structure can be formed on a BEOL device layer with a single mask process. The single mask process can reduce the number of mask processes to form the resistor and MIM capacitor structures and reduce the parasitic capacitances generated by the resistor structure.

FIG. 1A illustrate a cross-sectional view of a semiconductor structure 100 having a resistor structure and a MIM capacitor structure on a BEOL device layer 106, in accordance with some embodiments. FIG. 1B illustrate a mask of BEOL device layer 106 in semiconductor structure 100, in accordance with some embodiments. FIGS. 2A-2F illustrate various cross-sectional views of a zoomed-in region 110 of semiconductor structure 100 having resistor and MIM capacitor structures, in accordance with some embodiments.

As shown in FIG. 1A, semiconductor structure 100 can include a substrate 102, a first interconnect structure 104 disposed on substrate 102, BEOL device layer 106 disposed on first interconnect structure 104, and a second interconnect structure 108 disposed on BEOL device layer 106. As shown in FIG. 1B, the mask of BEOL device layer 106 can include a first mask area 112 and a second mask area 114. In some embodiments, first mask area 112 can include a MIM capacitor structure and second mask area 114 can include a resistor structure.

Referring to FIG. 1A, the MIM capacitor structure and resistor structure can be formed in BEOL device layer 106 on substrate 102. In some embodiments, substrate 102 can include a silicon (Si) substrate. In some embodiments, substrate 102 can include (i) another elementary semiconductor, such as germanium (Ge); (ii) a compound semiconductor, such as silicon carbide (SiC); (iii) an alloy semiconductor, such as silicon germanium (SiGe); or (iv) combinations thereof. In some embodiments, substrate 102 can include a semiconductor on insulator (SOI). In some embodiments, substrate 102 can include an epitaxial material. In some embodiments, substrate 102 can include a FEOL device layer (not shown in FIG. 1A). The FEOL device layer can include one or more semiconductor devices (e.g., transistors). In some embodiments, The FEOL device layer can include a logic device, a memory device, and other suitable semiconductor devices.

First and second interconnect structures 104 and 108 can electrically connect the one or more semiconductor devices on substrate 102 to BEOL device layer 106 and other parts of semiconductor structure 100 or the IC package including semiconductor structure 100. In some embodiments, first and second interconnect structures 104 and 108 can include metal vias 103 and metal lines 105. Metal vias 103 can connect metal lines 105 above and below metal vias 103 in a Z-direction. Metal lines 105 can extend in an X- or Y-direction. Each one of connected metal vias 103 and metal lines 105 can form a conductive interconnect layer, for example, conductive interconnect layers M1-M11 as shown in FIG. 1A, to electrically connect the one or more semiconductor devices in the FEOL device layer to BEOL device layer 106 and other parts of semiconductor structure 100. Though first interconnect structure 104 in FIG. 1A includes nine conductive interconnect layers and second interconnect structure 108 includes one conductive interconnect layer, first and second interconnect structures 104 and 108 can include any suitable number of conductive interconnect layers. In some embodiments, first interconnect structure 104 can include at least six conductive interconnect layers to reduce the parasitic capacitance caused by the resistor structure in BEOL device layer 106. In some embodiments, metal vias 103 and metal lines 105 can include any suitable conductive materials, such as tungsten (W), aluminum (Al), copper (Cu), cobalt (Co), titanium (Ti), tantalum (Ta), ruthenium (Ru), a silicide material, and a conductive nitride material.

Intermetallic dielectric layers 107 can include one or more insulating layers to provide electrical insulation between interconnect structures in semiconductor structure 100, as shown in FIG. 1A. In some embodiments, intermetallic dielectric layers 107 can include silicon oxide ($SiO_2$), plasma enhanced oxide (PEOX), undoped silica glass (USG), fluorinated silica glass (FSG), a low-k dielectric material (e.g., material with a dielectric constant less than about 3.9), an extremely low-k dielectric material (e.g., material with a dielectric constant less than about 2.5), other suitable materials, or combinations thereof. In some embodiments, thicknesses of intermetallic dielectric layers 107 can range, for example, from about 500 nm to about 1000 nm.

BEOL device layer 106 can include a MIM capacitor structure 210 in first mask area 112 and a resistor structure 202-2 in second mask area 114, as shown in FIGS. 2A-2F. In some embodiments, a distance 106d between first and second mask areas 112 and 114 can range from about 1.5 μm to about 1000 μm. If distance 106d is less than about 1.5 μm, the capacitance of MIM capacitor structure 210 may shift from its required value. If distance 106d is greater than about 1000 μm, MIM capacitor structure 210 and resistor structure 202-2 may not be formed by a single mask process. Referring to FIGS. 2A-2F, semiconductor structure 100 can further include an etch stop layer (ESL) 222, a first insulating layer 224, a second insulating layer 232, a hard mask layer 234, a protect layer 208, capping structures 212-1 and 212-2 (collectively referred to as "capping structures 212"), and interconnect structures 203-1, 203-2, 203-3, and 203-4 (collectively referred to as "interconnect structures 203"). In some embodiments, FIGS. 2A-2F can include different capping layers on resistor structure 202-2 due to various process differences.

As shown in FIGS. 2A-2F, ESL 222 can be disposed on first interconnect structure 104 and intermetallic dielectric layers 107. ESL 222 can act as the etch stop point during the formation of interconnect structures. In some embodiments, ESL 222 can include a dielectric material composed of silicon, carbon, and/or nitrogen. In some embodiments, ESL 222 can include a layer of silicon carbide (SiC), a layer of silicon carbon nitride (SiCN), a layer of silicon oxycarbonitride (SiOCN), a layer of silicon oxide carbide (SiOC), or combinations thereof. In some embodiments, ESL 222 can have a thickness 222t ranging from about 40 nm to about 80 nm.

First insulating layer 224 can be disposed on ESL 222 and can act as a buffer layer for subsequently formed MIM capacitor structure 210 and resistor structure 202-2 to reduce defects. In some embodiments, first insulating layer 224 can include a uniform oxide layer. In some embodiments, first insulating layer 224 can include a layer of PEOX, USG, FSG, a low-k dielectric material (e.g., material with a dielectric constant less than about 3.9), an extremely low-k dielectric material (e.g., material with a dielectric constant less than about 2.5), other suitable materials, or combinations thereof. In some embodiments, first insulating layer 224 can be deposited by plasma enhanced chemical vapor deposition (PECVD), In some embodiments, first insulating layer 224 can have a thickness 224t ranging from about 80 nm to about 120 nm.

MIM capacitor structure 210 and resistor structure 202-2 can be disposed on first insulating layer 224, as shown in FIGS. 2A-2F. MIM capacitor structure 210 can include a first capacitor plate 202-1, a high-k dielectric layer 204-1, and a second capacitor plate 206-1. In some embodiments, bottom surfaces of MIM capacitor structure 210 and resistor structure 202-2 can be on the same level and can be coplanar. In some embodiments, first capacitor plate 202-1 and resistor structure 202-2 can be conformally formed on first insulating layer 224 and can include titanium nitride (TiN), Al, Cu, W, an aluminum copper alloy (AlCu), metal silicide, other suitable metals or metal alloys, or combinations thereof. In some embodiments, first capacitor plate 202-1 and resistor structure 202-2 can include more than one layer. In some embodiments, first capacitor plate 202-1 can have a thickness 202-1t ranging from about 30 nm to about 70 nm. If thickness 202-1t is less than about 30 nm, first capacitor plate 202-1 may be over etched in subsequent processes. If thickness 202-1t is greater than about 70 nm, under etch may occur and residues may remain on first capacitor plate 202-1. In some embodiments, resistor structure 202-2 can have a thickness 202-2t ranging from about 30 nm to about 150 nm. In some embodiments, thickness 202-2t can be equal to or greater than thickness 202-1t. In some embodiments, thickness 202-2t can be closer to about 30 nm to form a high resistance resistor. In some embodiments, thickness 202-2t can be closer to about 150 nm to form a low resistance resistor. If thickness 202-2t is less than about 30 nm, resistor structure 202-2 may be over etched in subsequent processes. If thickness 202-2t is greater than about 150 nm, the fabrication process for resistor structure 202-2 may be complicated and the manufacturing cost may increase.

Figure 2A:
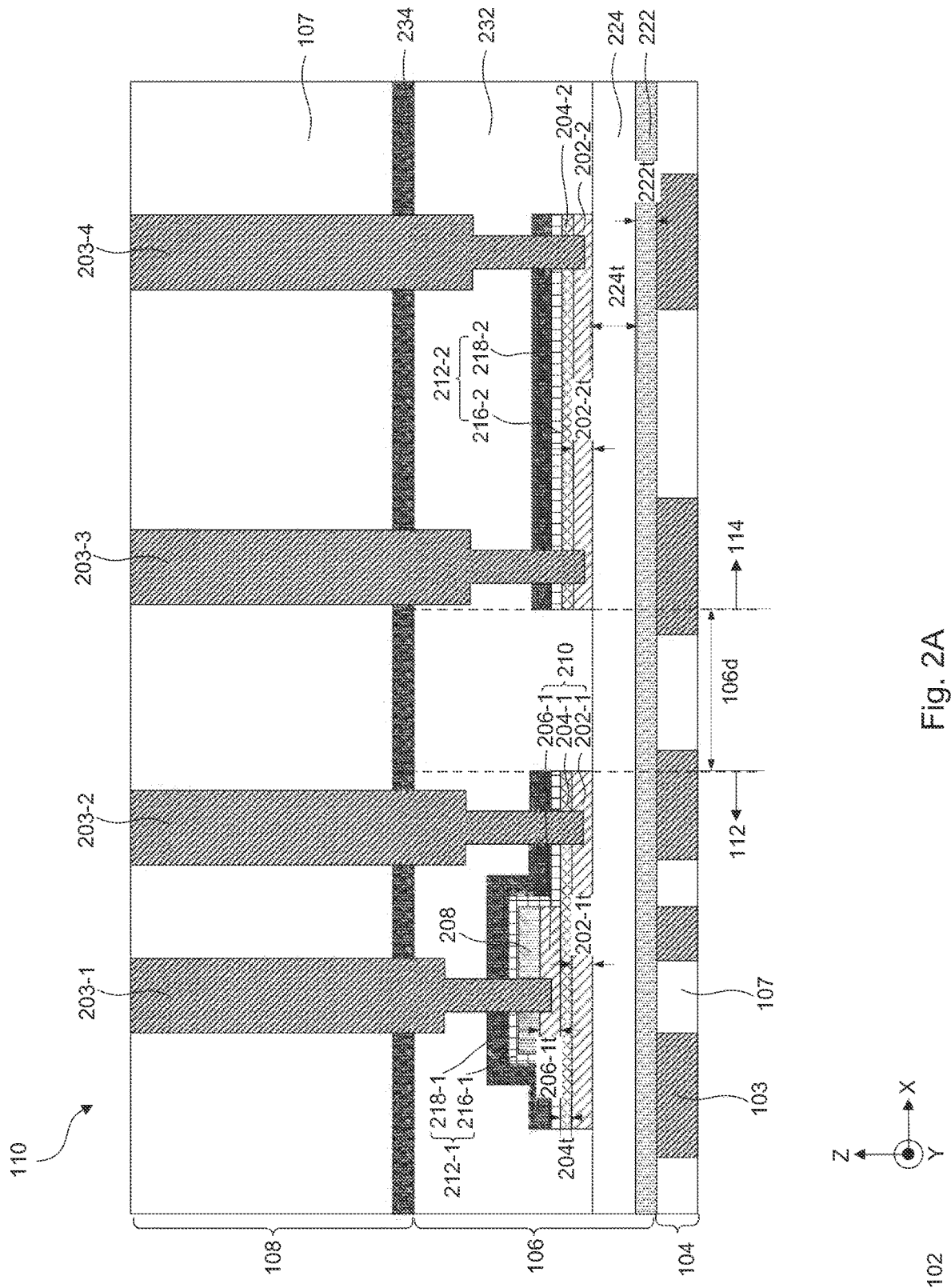
FIGS. 2A-2F illustrate cross-sectional views of a zoomed-in region of a semiconductor structure having a resistor structure and a MIM capacitor structure, in accordance with some embodiments.
Figure 2B:
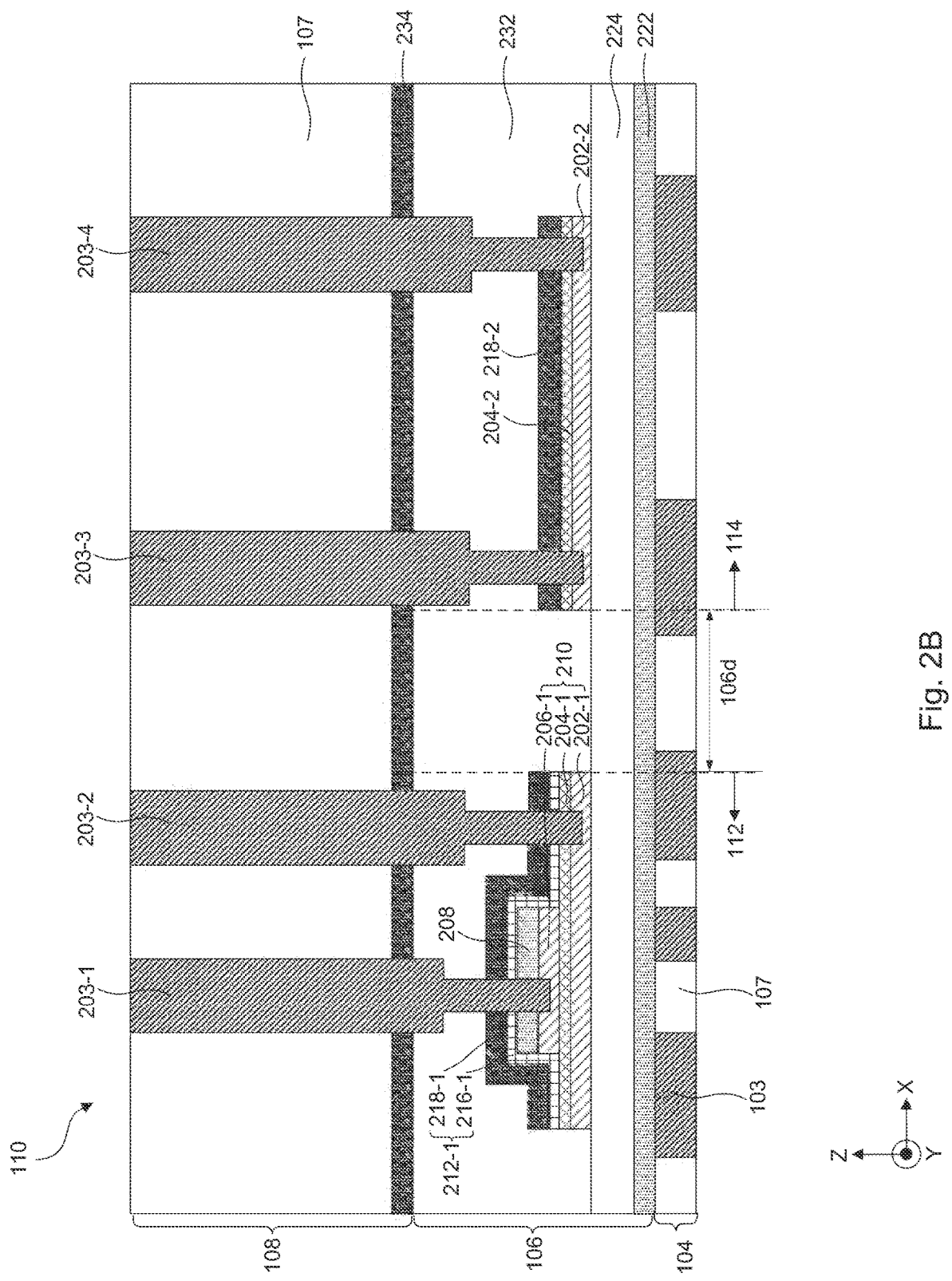
Figure 2C:
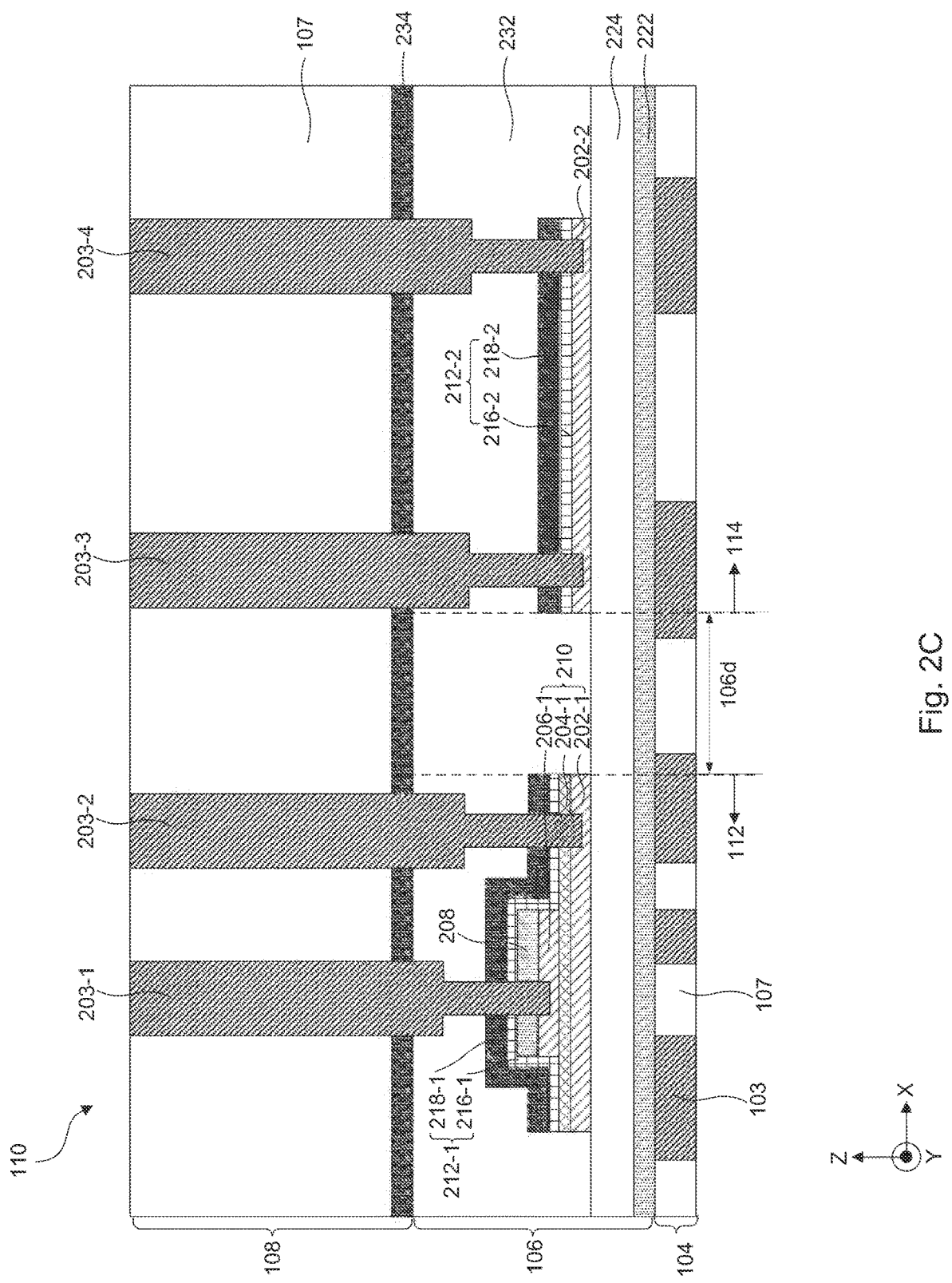
Figure 2D:
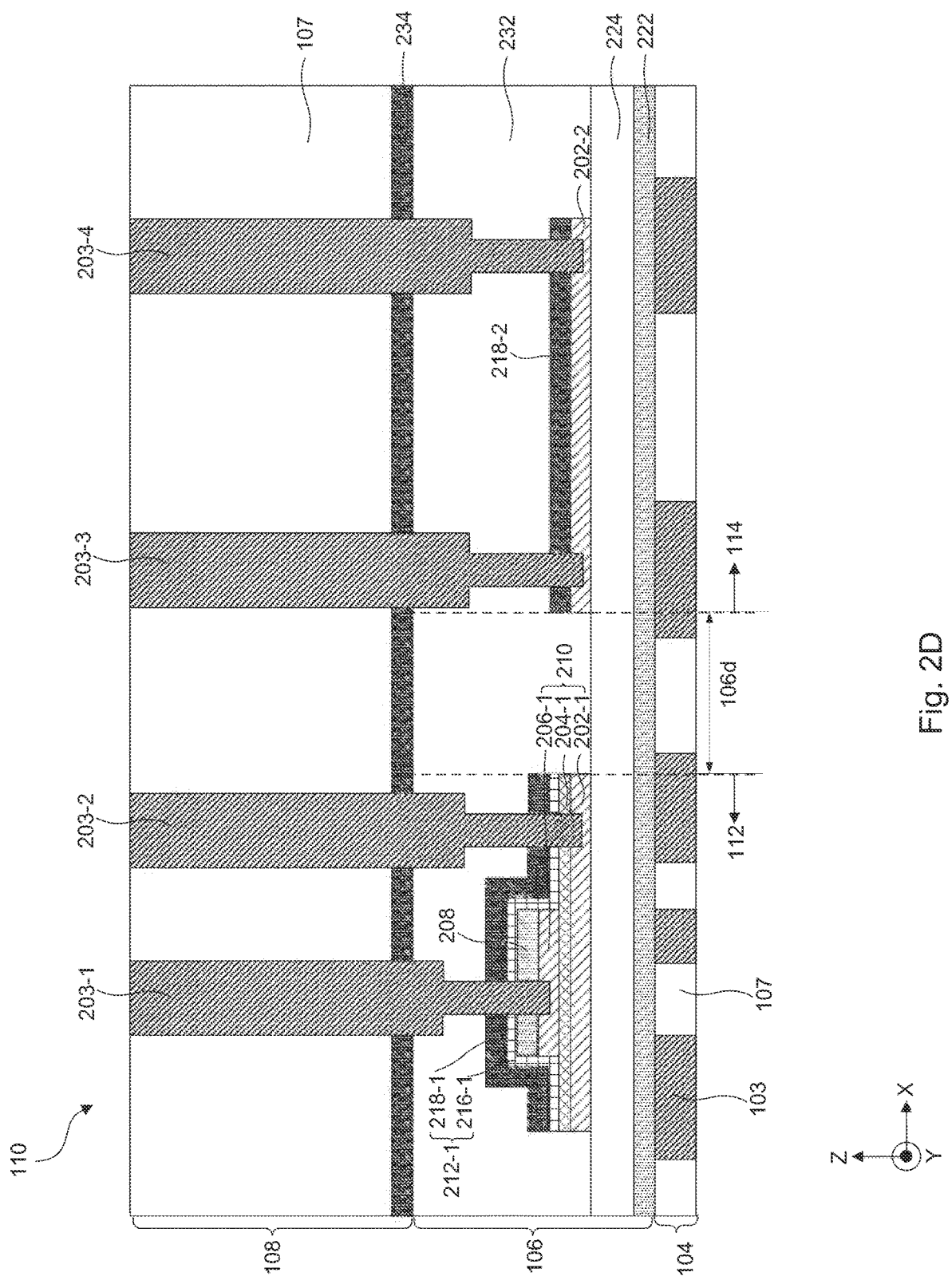
Figure 2E:
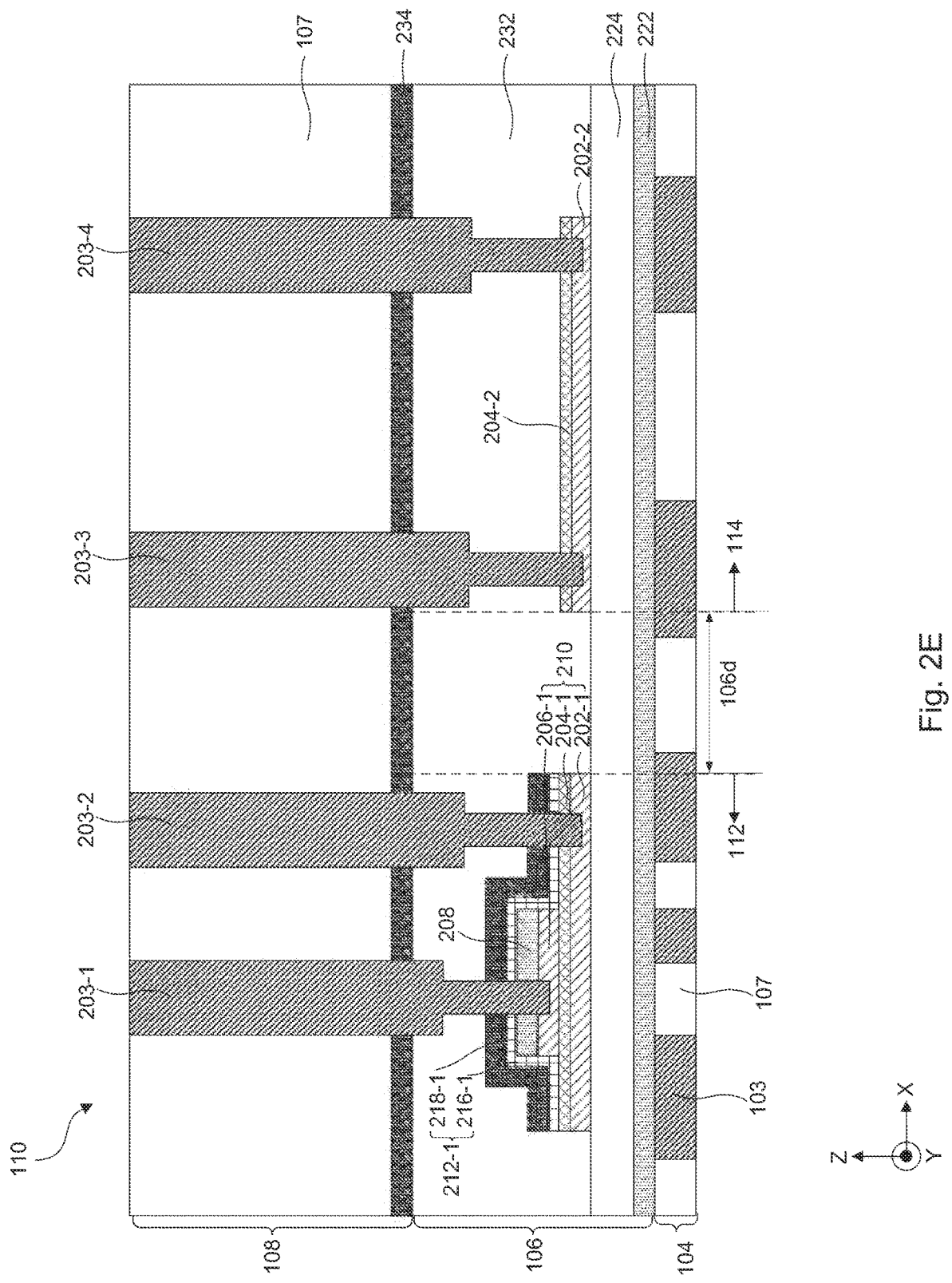

High-k dielectric layers 204-1 and 204-2 can be disposed on first capacitor plate 202-1 and resistor structure 202-2, as shown in FIGS. 2A, 2B, and 2E. In some embodiments, high-k dielectric layers 204-1 and 204-2 can include the same high-k dielectric material. The high-k dielectric material can have a dielectric constant between about 3.9 and about 1000 to increase the capacitance of MIM capacitor structure 210. If the dielectric constant is less than about 3.9, the dielectric material may reduce the capacitance of MIM capacitor structure 210. In some embodiments, high-k dielectric layers 204-1 and 204-2 can include any suitable high-k dielectric materials, such as silicon nitride (SiN), hafnium oxide ($HfO_2$), zirconium oxide ($ZrO_2$), aluminum oxide ($Al_2O_3$), other suitable dielectric materials, and combinations thereof. In some embodiments, high-k dielectric layers 204-1 and 204-2 can include one or more layers. In some embodiments, high-k dielectric layers 204-1 and 204-2 can have a thickness 204t ranging from about 1 nm to about 5 nm. If thickness 204t is less than about 1 nm, high-k dielectric layers 204-1 and 204-2 may not be uniform and continuous. If thickness 204t is greater than about 5 nm, the capacitance of MIM capacitor structure 210 may shift from the required value.

Second capacitor plate 206-1 can be disposed on high-k dielectric layer 204-1, as shown in FIGS. 2A-2F. In some embodiments, second capacitor plate 206-1 can include TIN, Al, Cu, W, AlCu, metal silicide, other suitable metals or metal alloys, or combinations thereof. In some embodiments, first capacitor plate 202-1, second capacitor plate 206-1, and resistor structure 202-2 can include the same conductive material, such as TiN. In some embodiments, second capacitor plate 206-1 can include more than one layer. In some embodiments, second capacitor plate 206-1 can have a thickness 206-1t ranging from about 30 nm to about 70 nm.

Protect layer 208 can be disposed on second capacitor plate 206-1, as shown in FIGS. 2A-2F. In some embodiments, protect layer 208 can include silicon oxynitride (SiON) and can act as a hard mask layer. In some embodiments, protect layer 208 can protect second capacitor plate 206-1 during the formation of MIM capacitor structure 210. In some embodiments, protect layer 208 can have a thickness 208t ranging from about 10 nm to about 50 nm.

As shown in FIGS. 2A-2F, capping structure 212-1 can be disposed on MIM capacitor structure 210. At least one layer of high-k dielectric layer 204-2 and capping structure 212-2 can be disposed on resistor structure 202-2 based on various processes. Capping structures 212 can protect MIM capacitor structure 210 and resistance structure 202-2. In some embodiments, capping structures 212-1 and 212-2 can include first capping sublayers 216-1 and 216-2, and second capping sublayers 218-1 and 218-2. In some embodiments, first capping sublayers 216-1 and 216-2 can include a layer of $SiO_2$ ranging from about 15 nm to about 25 nm. Second capping sublayers 218-1 and 218-2 can include a layer of SiN ranging from about 50 nm to about 75 nm.

Figure 2F:
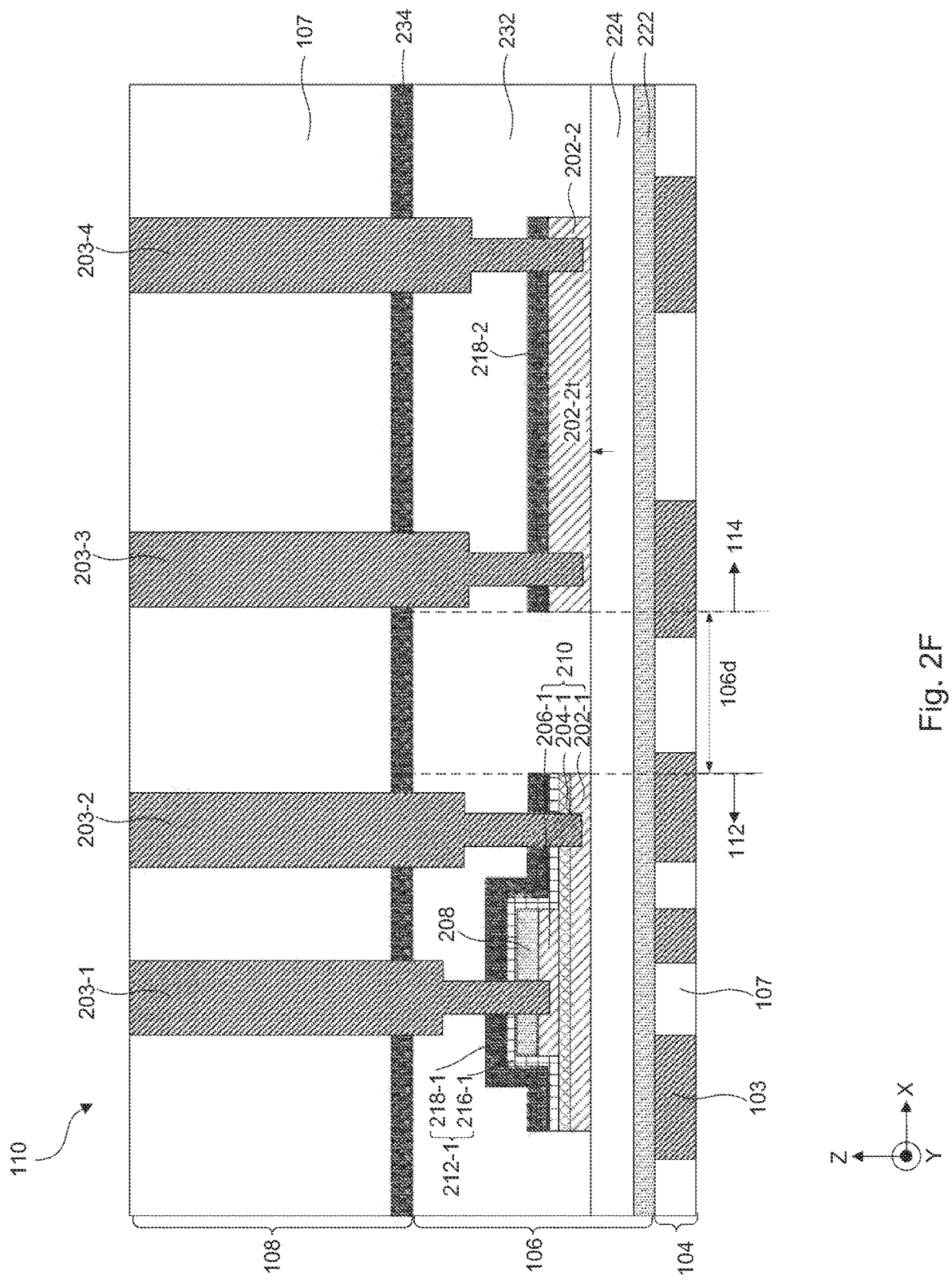

In some embodiments, as shown in FIG. 2A, capping structure 212-2 and high-k dielectric layer 204-2 can be disposed on resistor structure 202-2. In some embodiments, as shown in FIG. 2B, second capping sublayer 218-2 and high-k dielectric layer 204-2 can be disposed on resistor structure 202-2. In some embodiments, as shown in FIG. 2C, capping structure 212-2 can be disposed on resistor structure 202-2. In some embodiments, as shown in FIG. 2D, second capping sublayer 218-2 can be disposed on resistor structure 202-2. In some embodiments, as shown in FIG. 2E, high-k dielectric layer 204-2 can be disposed on resistor structure 202-2. In some embodiments, as shown in FIG. 2F, second capping sublayer 218-2 can be disposed on resistor structure 202-2 and thickness 202-2t of resistor structure 202-2 can be greater than thickness 202-1t of first capacitor plate 202-1.

Referring to FIGS. 2A-2F, hard mask layer 234 can be disposed on second insulating layer 232 for interconnect structure patterning. In some embodiments, hard mask layer 234 can include $SiO_2$, SiN, SiON, other suitable materials, or combinations thereof.

As shown in FIGS. 2A-2F, interconnect structures 203-1 and 203-2 can provide electrical connections to second and first capacitor plates 206-1 and 202-1 of MIM capacitor structure 210. Interconnect structures 203-3 and 203-4 can provide electrical connections to resistor structure 202-2. Interconnect structures 203 can be disposed in intermetallic dielectric layers 107, hard mask layer 234, and second insulating layer 232. In some embodiments, interconnect structures 203 can extend into first capacitor plate 202-1, second capacitor plate 206-1, and resistor structure 202-2 to ensure a reliable low resistance electrical contact. In some embodiments, the extension in the Z-direction can be greater than about 20 nm to ensure reliable low resistance electrical contact between metals of interconnect structures 203 and metals of first capacitor plate 202-1, second capacitor plate 206-1, and resistor structure 202-2. In some embodiments, interconnect structures 203 can include Cu, W, Al, other suitable metals, or combinations thereof.

In some embodiments, as shown in FIGS. 2A-2F, with MIM capacitor structure 210 and resistor structure 202-2 formed by a single mask process on first insulating layer 224, the number of mask processes to form the resistor and MIM capacitor structures can be reduced and the parasitic capacitances generated by the resistor structure can be reduced. Additionally, the single mask process can improve the manufacturing process and reduce the manufacturing cost.

Figure 3:
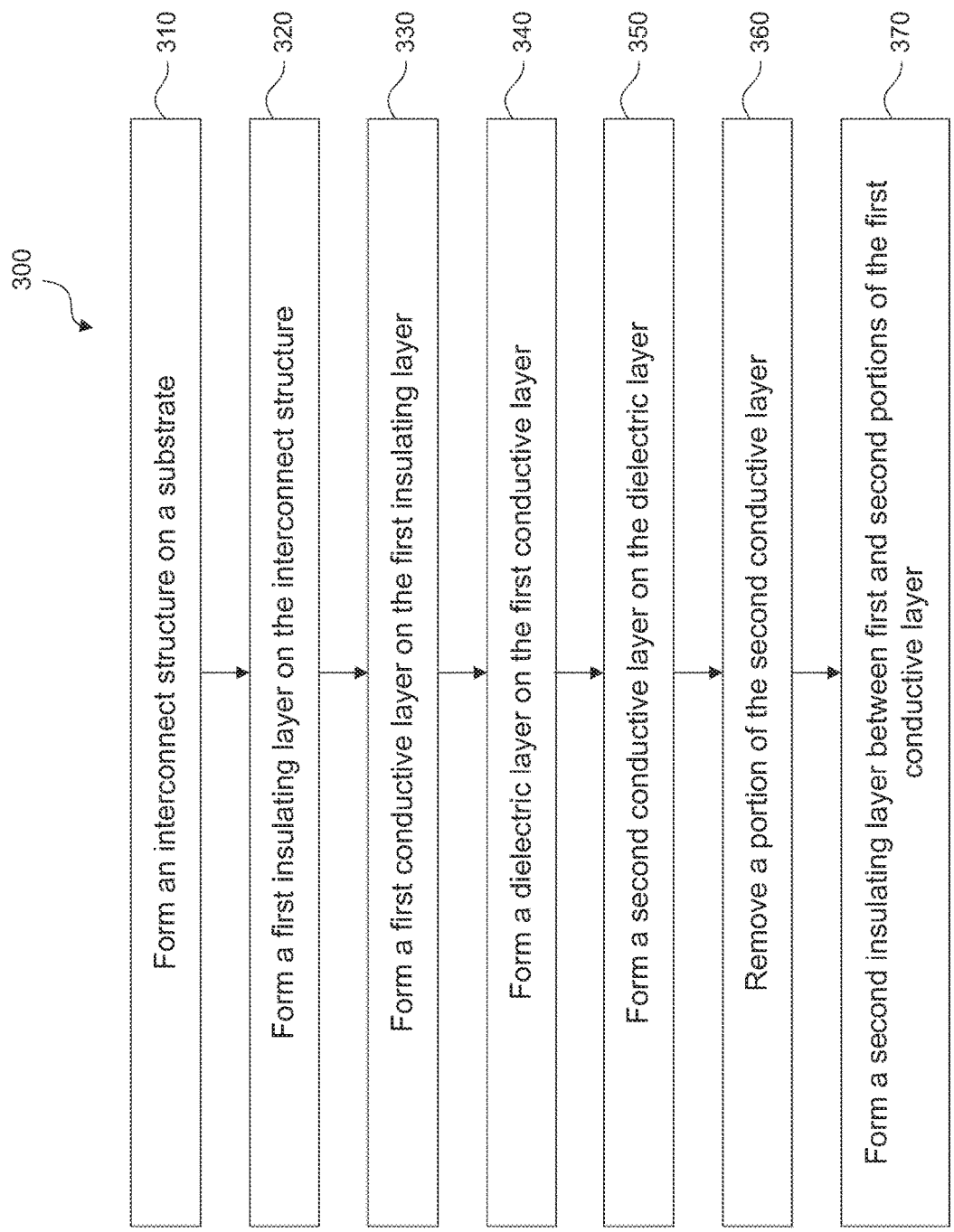
FIG. 3 illustrates a flow diagram of a method for forming a semiconductor structure having a resistor structure and a MIM capacitor structure, in accordance with some embodiments.

FIG. 3 is a flow diagram of a method 300 for fabricating a semiconductor structure having a resistor structure and a MIM capacitor structure, in accordance with some embodiments. Method 300 may not be limited to semiconductor structure 100 and can be applicable to other devices that would benefit from the single mask process for the MIM capacitor structure and resistor structure. Additional fabrication operations may be performed between various operations of method 300 and may be omitted merely for clarity and ease of description. Additional processes can be provided before, during, or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for zoomed-in region 110 of semiconductor structure 100 as illustrated in FIGS. 1A and 4-11. FIGS. 1A and 4-11 illustrate cross-sectional views of semiconductor structure 100 at various stages of its fabrication process, in accordance with some embodiments. Elements in FIGS. 4-11 with the same annotations as elements in FIGS. 1A, 1B, and 2A-2F are described above.

Figure 4:
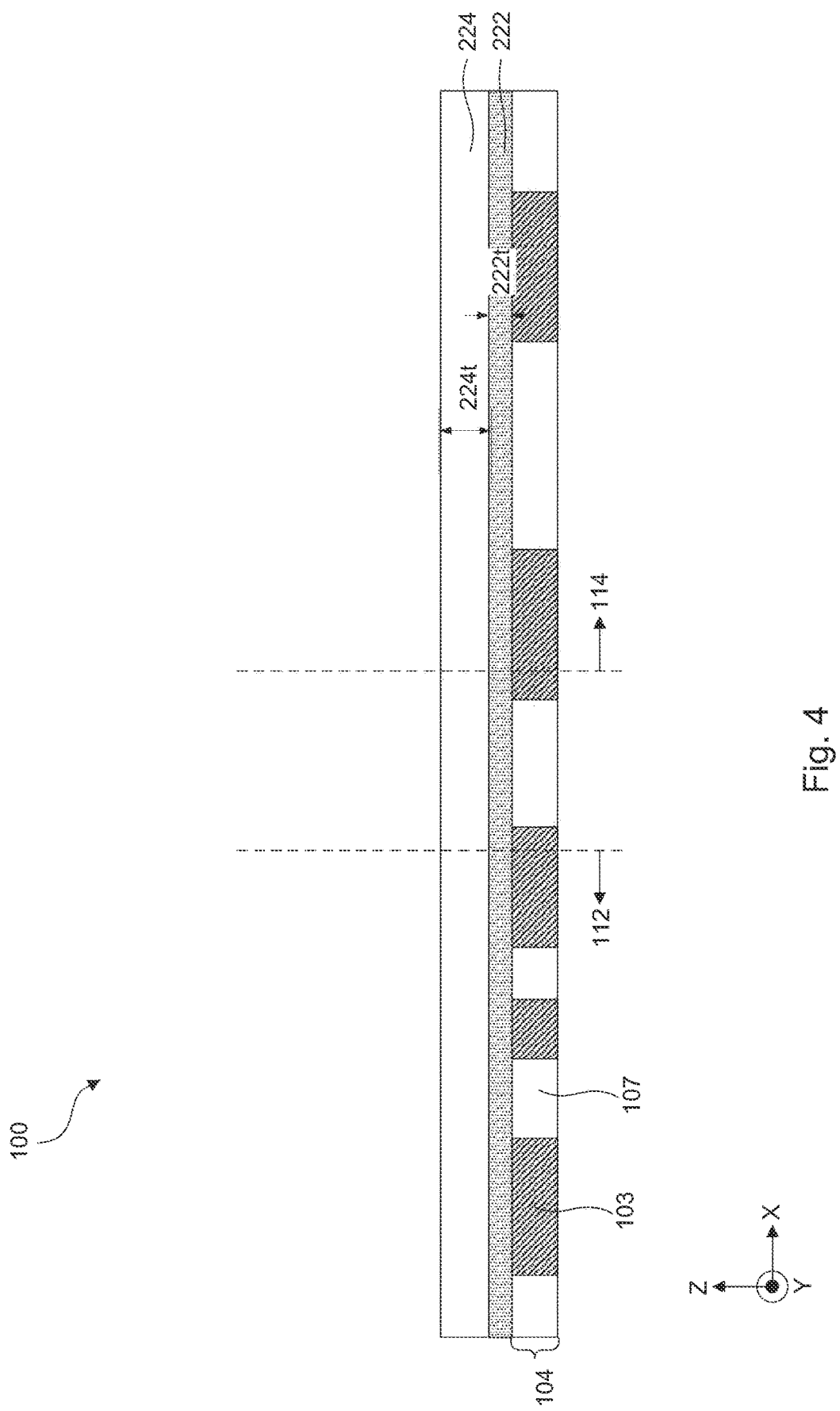
FIGS. 4-11 illustrate cross-sectional views of a semiconductor structure having a resistor structure and a MIM capacitor structure at various stages of its fabrication, in accordance with some embodiments.

In referring to FIG. 3, method 300 begins with operation 310 and the process of forming an interconnect structure on a substrate. For example, as shown in FIGS. 1A and 4, first interconnect structure 104 can be formed on substrate 102. Substrate 102 can include a Si substrate and a FEOL device layer, which includes one or more semiconductor devices (e.g., transistors), formed on the Si substrate. FIG. 4 illustrates a portion of first interconnect structure 104, such as metal vias 103. Other layers of metal lines 105 and metal vias 103 are not shown in FIG. 4.

As shown in FIGS. 1A and 4, intermetallic dielectric layers 107 can be formed on substrate 102 to provide electrical isolation between intermetallic dielectric layers 107 in semiconductor structure 100. In some embodiments, intermetallic dielectric layers 107 can be deposited by any suitable processes, such as atomic layer deposition (ALD), chemical vapor deposition (CVD), PECVD, other suitable methods, and combinations thereof. In some embodiments, intermetallic dielectric layers 107 can be deposited using PECVD at a temperature ranging from about 300° C. to about 500° C. In some embodiments, intermetallic dielectric layers 107 can include PEOX, USG, FSG, a low k material, an extremely low-k dielectric, other suitable materials, or combinations thereof. The extremely low-k material can include SiOC, SiCN, SiOCN, SiOCH, porous $SiO_2$, or combinations thereof.

First interconnect structure 104 can be formed in intermetallic dielectric layers 107, as shown in FIGS. 1A and 4. In some embodiments, the deposition of intermetallic dielectric layers 107 can be followed by selective etching of the deposited layer of intermetallic dielectric material to form openings (not shown). The openings can be filled with conductive material in a subsequent process to form metal vias 103 or metal lines 105 electrically isolated from each other by intermetallic dielectric layers 107. In some embodiments, the selective etching can be performed by a dry etching process. In some embodiments, the conductive materials of metal vias 103 and metal lines 105 can include W, Al, Cu, Co, Ti, Ta, Ru, a silicide material, or a conductive nitride material. Each one of connected metal vias 103 and metal lines 105 can form a conductive interconnect layer. In some embodiments, first interconnect structure 104 can include multiple conductive interconnect layers, such as conductive interconnect layers M1-M9 as shown in FIG. 1A. In some embodiments, first interconnect structure 104 can include at least six conductive interconnect layers (e.g., conductive interconnect layers M1-M6) to reduce the parasitic capacitance of semiconductor structure 100.

The formation of first interconnect structure 104 can be followed by the formation of ESL 222. In some embodiments, as shown in FIGS. 1A and 4, ESL 222 can be conformally deposited on intermetallic dielectric layers 107 and first interconnect structure 104 by CVD, ALD, and other suitable deposition methods. In some embodiments, ESL 222 can include a dielectric material, such as SiC, SiCN, SiOC, and SiOCN. In some embodiments, ESL 222 can have a thickness 222t ranging from about 40 nm to about 80 nm. ESL 222 can protect metal vias 103 and can act as the etch stop point in subsequent processes.

Referring to FIG. 3, in operation 320, a first insulating layer can be formed on the interconnect structure. For example, as shown in FIG. 4, first insulating layer 224 can be formed on first interconnect structure 104 and ESL 222. In some embodiments, first insulating layer 224 can include an oxide layer conformally deposited on ESL 222 by PECVD, CVD, and other suitable deposition methods. In some embodiments, first insulating layer 224 can include $SiO_2$, SiON, SiOCN, and other suitable insulating materials. In some embodiments, first insulating layer 224 can have a thickness 224t ranging from about 80 nm to about 120 nm. In some embodiments, first insulating layer 224 can be uniformly deposited on first mask area 112 and second mask area 114.

Figure 5:
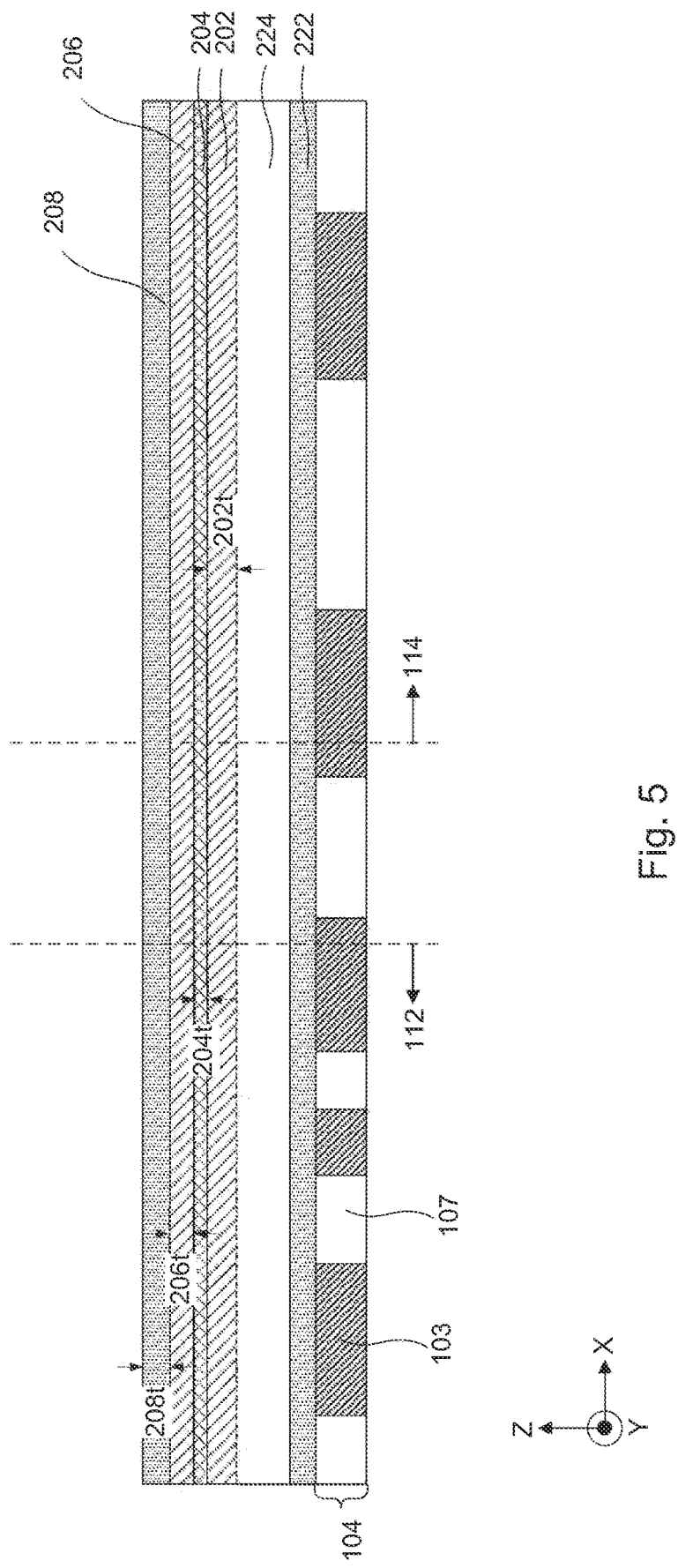

Referring to FIG. 3, in operation 330, a first conductive layer is formed on the first insulating layer. For example, as shown in FIG. 5, first conductive layer 202 can be formed on first insulating layer 224. In some embodiments, first conductive layer 202 can be conformally deposited on first insulating layer 224 by PVD, ALD, molecular beam epitaxy (MBE), high density plasma CVD (HDPCVD), metal organic CVD (MOCVD), remote plasma CVD (RPCVD), plating, other suitable methods, or combinations thereof. The deposition process can be performed in a deposition chamber, such as a PVD chamber, at a pressure below about 20 mTorr and at a temperature of about 100° C. The power level used in the deposition process can range from about 1000 W to about 6000 W. In some embodiments, the conductive material can include TiN, AlCu, Al, Cu, other suitable conductive materials, or combinations thereof. In some embodiments, the conductive material can include TiN. In some embodiments, first conductive layer 202 can have a thickness 202$t$ ranging from about 30 nm to about 70 nm.

Referring to FIG. 3, in operation 340, a dielectric layer is formed on the first conductive layer. For example, as shown in FIG. 5, high-k dielectric layer 204 can be formed on first conductive layer 202. In some embodiments, high-k dielectric layer 204 can include a high-k dielectric material conformally deposited by CVD, ALD, PECVD, or other suitable deposition methods. The high-k dielectric material can include $HfO_2$, $ZrO_2$, $Al_2O_3$, SiN, or other suitable dielectric materials. The high-k dielectric material can have a k-value greater than about 3.9 depending on the type of material. In some embodiments, high-k dielectric layer 204 can include SiN with a k-value of about 7, deposited with a PECVD process at a deposition temperature from about 150° C. to about 200° C. In some embodiments, high-k dielectric layer 204 can be a dielectric stack-which may include a bottom layer of $ZrO_2$, a middle layer of $Al_2O_3$, a top layer of $ZrO_2$—that can be deposited at a temperature of from about 200° C. to about 250° C. and have a k-value greater than about 13 (e.g., about 13.6). In some embodiments, high-k dielectric layer 204 can be a stack that includes hafnium-based dielectrics (e.g., $HfO_2$ and hafnium silicate ($HfSiO_x$)), titanium oxide ($TiO_2$), or tantalum oxide ($TaO_x$). High-k dielectric layer 204 can also include a liquid phase high-k polymer that can be cured and hardened at a temperature below about 250° C. Additionally, high-k dielectric layer 204 can include strontium titanium oxide ($SrTiO_3$) with a k-value between about 100 and about 200, barium-titanium oxide ($BaTiO_3$) with a k-value between about 300 and about 600, barium-strontium-titanium oxide ($BaSrTiO_3$) with a k-value of between about 500 and 1000, or lead-zirconium-titanium oxide ($PbZrTiO_3$) with a k-value between about 800 and about 1100. In some embodiments, high-k dielectric layer 204 can have a thickness 204$t$ ranging from about 1 nm to about 5 nm.

Referring to FIG. 3, in operation 350, a second conductive layer is formed on the dielectric layer. For example, as shown in FIG. 5, second conductive layer 206 can be formed on high-k dielectric layer 204. In some embodiments, second conductive layer 206 can be conformally deposited on high-k dielectric layer 204 by the same deposition method as first conductive layer 202. In some embodiments, second conductive layer 206 can include a conductive material, such as TiN, AlCu, Al, Cu, other suitable conductive materials, and combinations thereof. In some embodiments, first and second conductive layers 202 and 206 can include the same conductive material, such as TiN. In some embodiments, second conductive layer 206 can have a thickness 206$t$ ranging from about 30 nm to about 70 nm.

The formation of second conductive layer 206 can be followed by the formation of protect layer 208, as shown in FIG. 5. In some embodiments, protect layer 208 can be conformally deposited on second conductive layer 206 by CVD, ALD, and other suitable deposition methods. In some embodiments, protect layer 208 can include SiON and can act as a hard mask layer to protect second capacitor plate 206-1 during subsequent processes. In some embodiments, protect layer 208 can have a thickness 208$t$ ranging from about 10 nm to about 50 nm.

Figure 6:
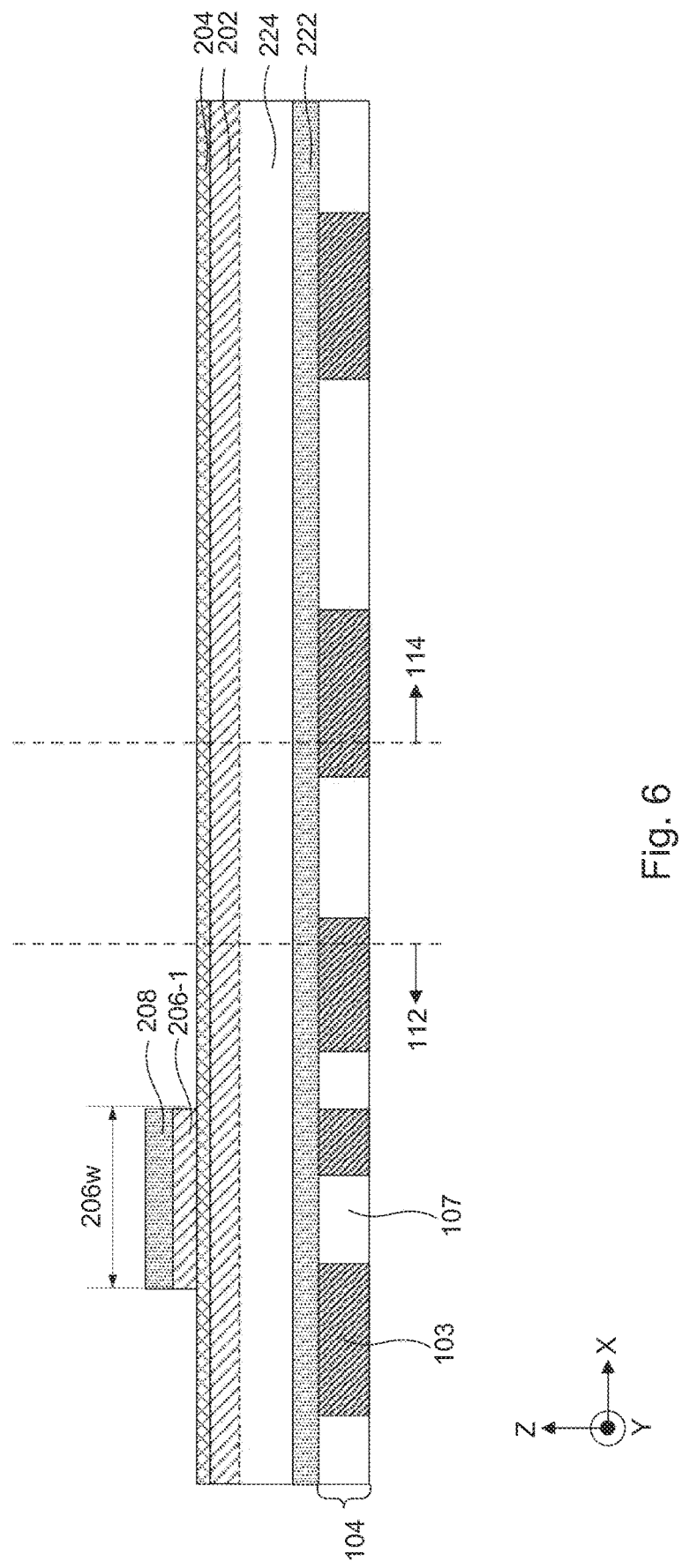

Referring to FIG. 3, in operation 360, a portion of the second conductive layer is removed. For example, as shown in FIG. 6, a portion of second conductive layer 206 and protect layer 208 can be removed. In some embodiments, photolithography and etch operations can be processed on the protect layer 208 and second conductive layer 206 to form second capacitor plate 206-1 of MIM capacitor structure 210. A masking layer can be formed on protect layer 208 to pattern second conductive layer 206. The masking layer can protect regions of protect layer 208 and second capacitor plate 206-1 during the etching process. Composition of the masking layer can include a photoresist, a hard mask, and/or other suitable materials. The patterning process can include forming the masking layer over protect layer 208, exposing the photoresist to a pattern, performing post-exposure bake processes, and developing the photoresist to form a masking element including the photoresist. The masking element can be used to protect regions of protect layer 208 and second capacitor plate 206-1 while one or more etching processes sequentially remove exposed protect layer 208 and second conductive layer 206. High-k dielectric layer 204 can act as an etch stop layer for etching second conductive layer 206. In some embodiments, after the removal of the portion of protect layer 208 and second conductive layer 206, second capacitor plate 206-1 can have a width 206$w$ ranging from about 0.5 μm to about 10 μm.

Figure 7:
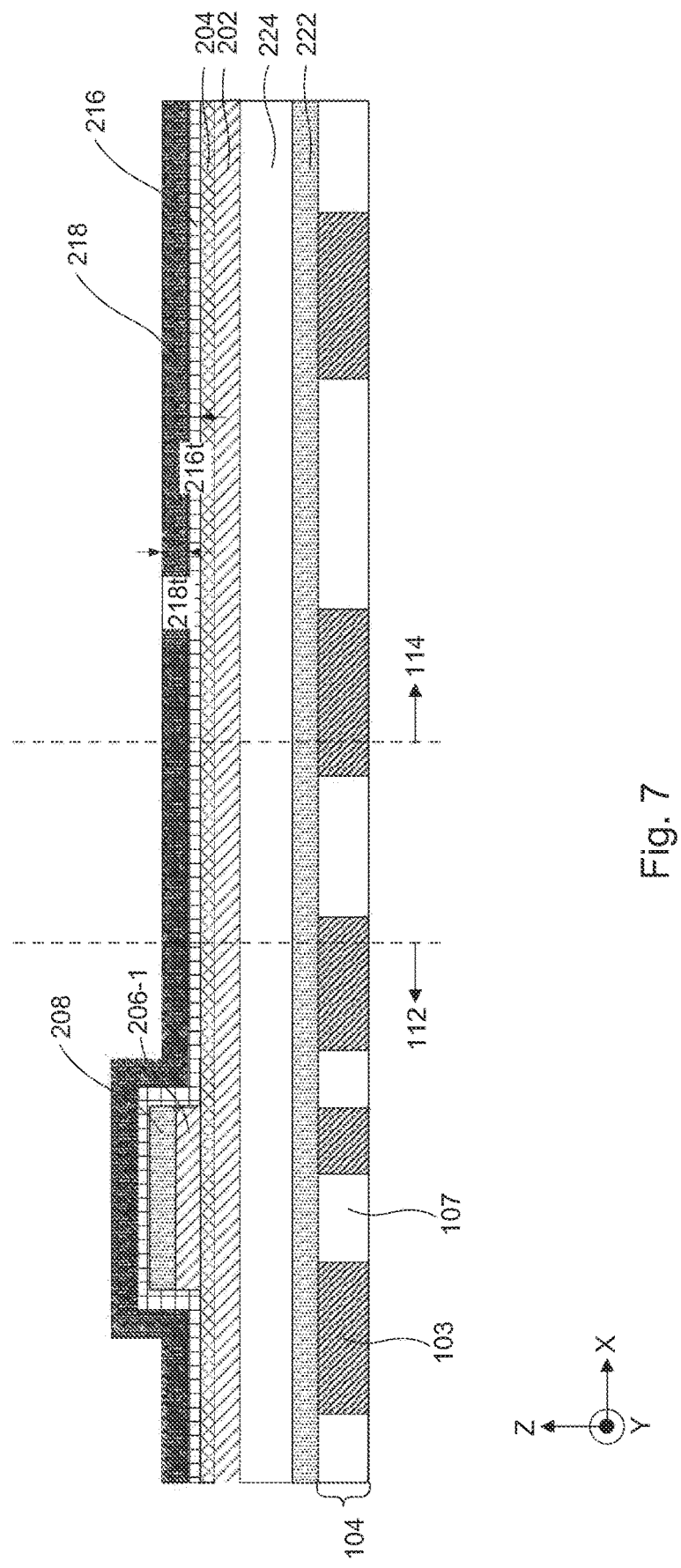

The removal of the portion of second conductive layer 206 can be followed by the formation of first and second capping sublayers 216 and 218, as shown in FIG. 7. In some embodiments, capping sublayer 216 can be conformally deposited on protect layer 208 and high-k dielectric layer 204 by CVD, ALD, and other suitable deposition methods. In some embodiments, first capping sublayer 216 can include $SiO_2$ and can have a thickness 216$t$ ranging from about 15 nm to about 50 nm. In some embodiments, second capping sublayer 218 can include SiN and can have a thickness 218$t$ ranging from about 50 nm to about 75 nm. If thickness 216$t$ is less than about 15 nm, or thickness 218$t$ is less than about 50 nm, over etch may occur in subsequent processes and high-k dielectric layer 204 may be damaged. If thickness 216$t$ is greater than about 50 nm, or thickness 218$t$ is greater than about 75 nm, under etch may occur in subsequent processes and residues may remain on high-k dielectric layer 204.

Figure 8:
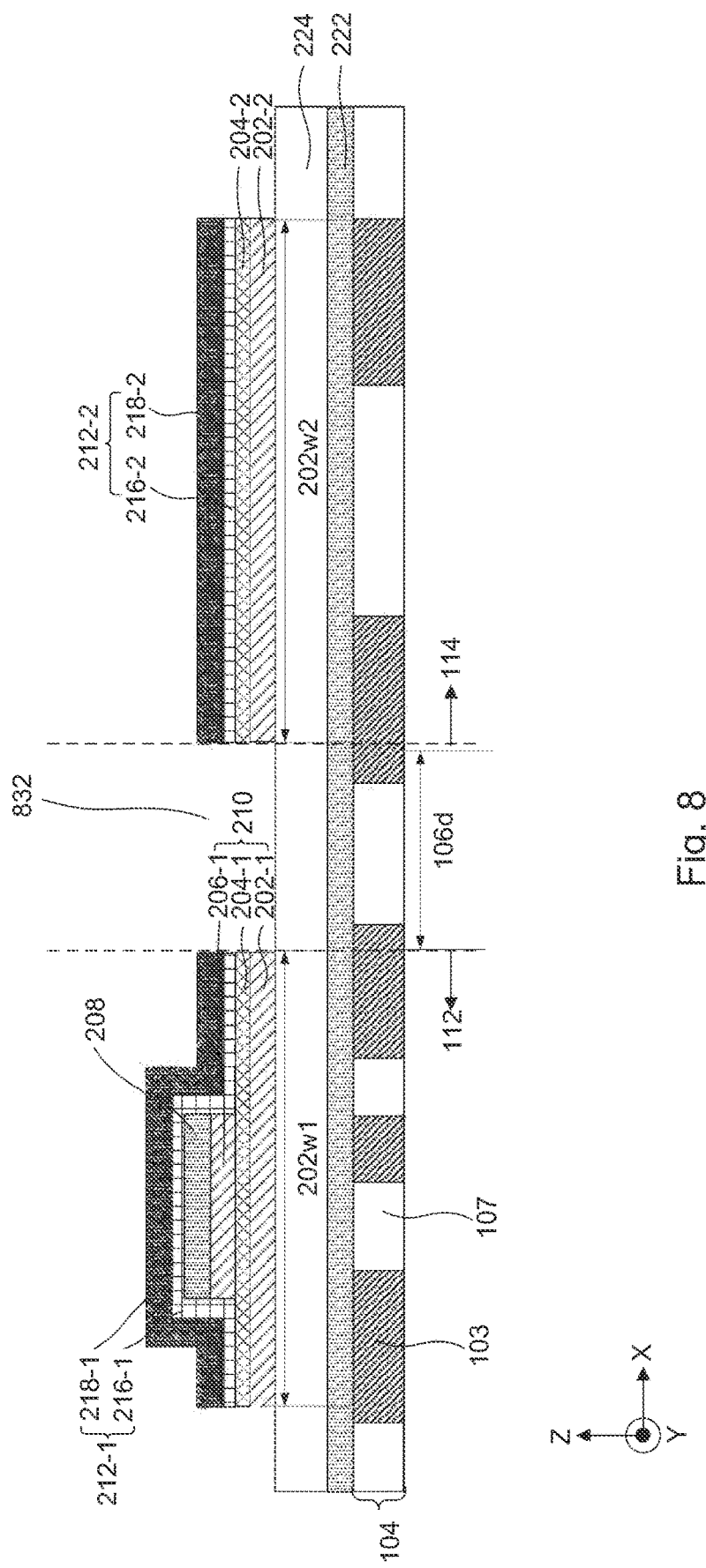
Figure 9:
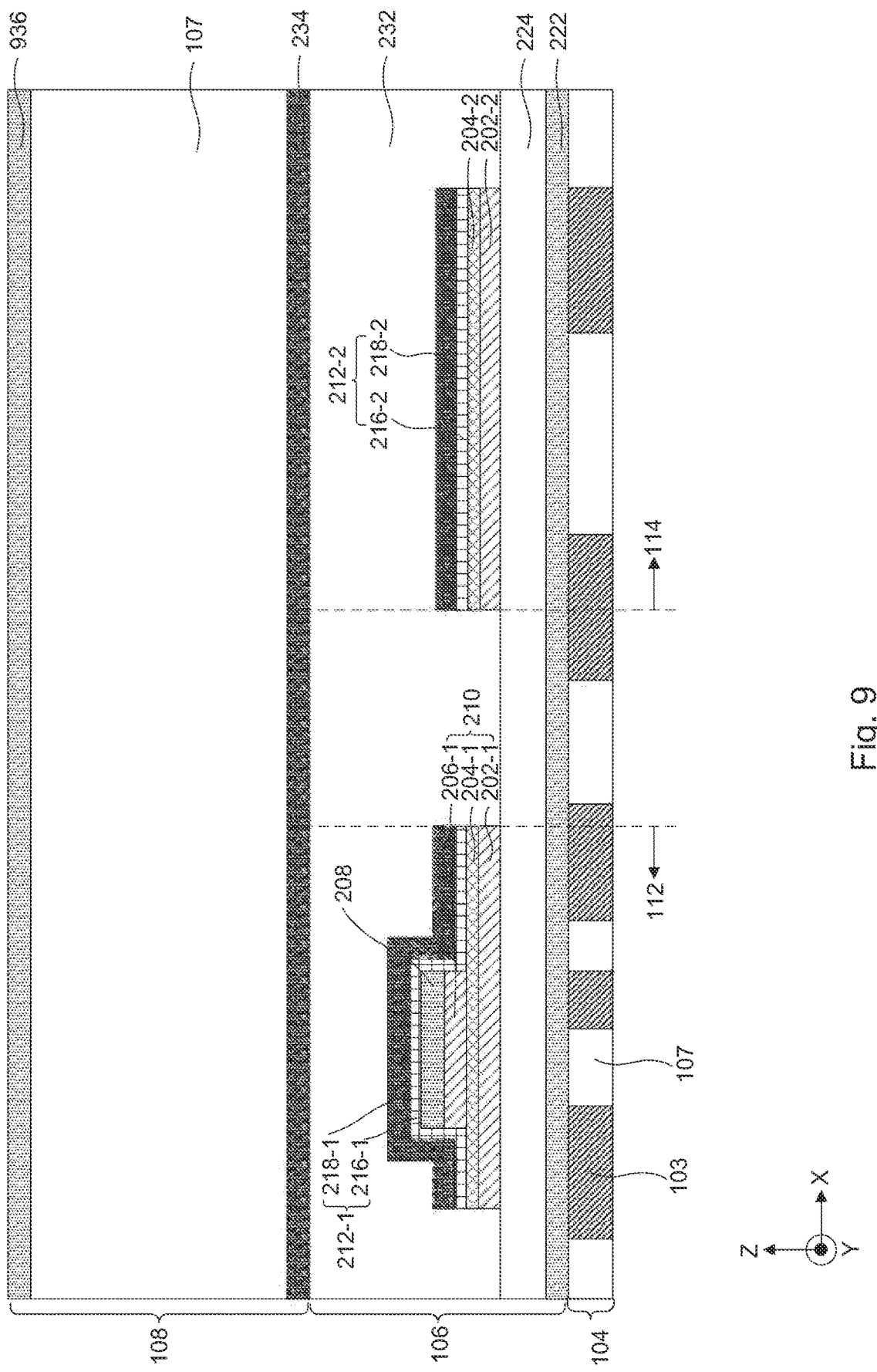

Referring to FIG. 3, in operation 370, a second insulating layer is formed between first and second portions of the first conductive layer. For example, as shown in FIGS. 8 and 9, second insulating layer 232 can be formed between first and second portions 202-1 and 202-2 of first conductive layer 202. First portion 202-1 can also be referred to as first capacitor plate 202-1 of MIM capacitor structure 210. Second portion 202-2 can also be referred to as resistor structure 202-2.

The formation of first and second capping sublayers 216 and 218 can be followed by removing a portion of capping sublayers 216 and 218, a portion of high-k dielectric layer 204, and a portion of first conductive layer 202, as shown in FIG. 8. In some embodiments, the removal process can include a dry etching process to form an opening 832 between first mask area 112 and second mask area 114. In some embodiments, the dry etching process can be directional and can include multiple etching operations. The dry etching process can use etchants including hexafluoro-1,3-butadiene ($C_4F_6$), perfluoroisobutylene ($C_4F_8$), chlorine ($Cl_2$), and oxygen ($O_2$). In some embodiments, after the dry etching process, opening 832 can have a width equal to distance 106d between first mask area 112 and second mask area 114. In some embodiments, distance 106d ranges from about 1.5 μm to about 1000 μm. First capacitor plate 202-1, high-k dielectric layer 204-1, and second capacitor plate 206-1 can form MIM capacitor structure 210. First capping sublayer 216-1 and second capping sublayer 218-1 can form capping structure 212-1. First capping sublayer 216-2 and second capping sublayer 218-2 can form capping structure 212-2. In some embodiments, MIM capacitor structure 210 can have a width 202w1 ranging from about 0.5 μm to about 200 μm. In some embodiments, resistor structure 202-2 can have a width 202w2 ranging from about 0.5 μm to about 200 μm.

The formation of opening 832 can be followed by the formation of second insulating layer 232, as shown in FIG. 9. In some embodiments, second insulation layer 232 can be deposited on capping structures 212-1 and 212-2 and first insulating layer 224 to fill opening 832 and cover MIM capacitor structure 210 and resistor structure 202-2. In some embodiments, second insulating layer 232 can include an oxide layer deposited by CVD, ALD, PECVD, or other suitable deposition methods. The oxide layer can include PEOX, USG, FSG, a low-k dielectric material (e.g., material with a dielectric constant less than about 3.9), an extremely low-k dielectric material (e.g., material with a dielectric constant less than about 2.5), other suitable materials, or combinations thereof. In some embodiments, second insulating layer 232 can be deposited by PECVD, In some embodiments, second insulating layer 232 can have a thickness ranging from about 100 nm to about 500 nm.

The formation of second insulating layer 232 can be followed by the formation of hard mask layer 234, as shown in FIG. 9. In some embodiments, hard mask layer 234 can be conformally deposited on second insulating layer 232 by CVD, ALD, PECVD, or other suitable deposition methods. In some embodiments, hard mask layer 234 can include $SiO_2$, SiN, SiON, other suitable materials, or combinations thereof. In some embodiments, hard mask layer 234 can have a thickness along a Z-axis ranging from about 40 nm to about 70 nm.

The formation of hard mask layer 234 can be followed by the formation of intermetallic dielectric layers 107, as shown in FIG. 9. In some embodiments, intermetallic dielectric layers 107 can be conformally deposited on hard mask layer 234 by CVD, ALD, PECVD, or other suitable deposition methods. In some embodiments, intermetallic dielectric layers 107 can include PEOX, USG, FSG, a low k material, an extremely low-k dielectric, other suitable materials, or combinations thereof. In some embodiments, intermetallic dielectric layers 107 can have a thickness ranging from about 800 nm to about 1100 nm.

The formation of intermetallic dielectric layers 107 can be followed by the formation of a top mask layer 936, as shown in FIG. 9. In some embodiments, top mask layer 936 can be conformally deposited on intermetallic dielectric layers 107 by CVD, ALD, PECVD, or other suitable deposition methods. In some embodiments, top mask layer 936 can include $SiO_2$, SiN, SiON, other suitable materials, or combinations thereof. In some embodiments, top mask layer 936 can have a thickness along a Z-axis ranging from about 40 nm to about 80 nm.

Figure 10:
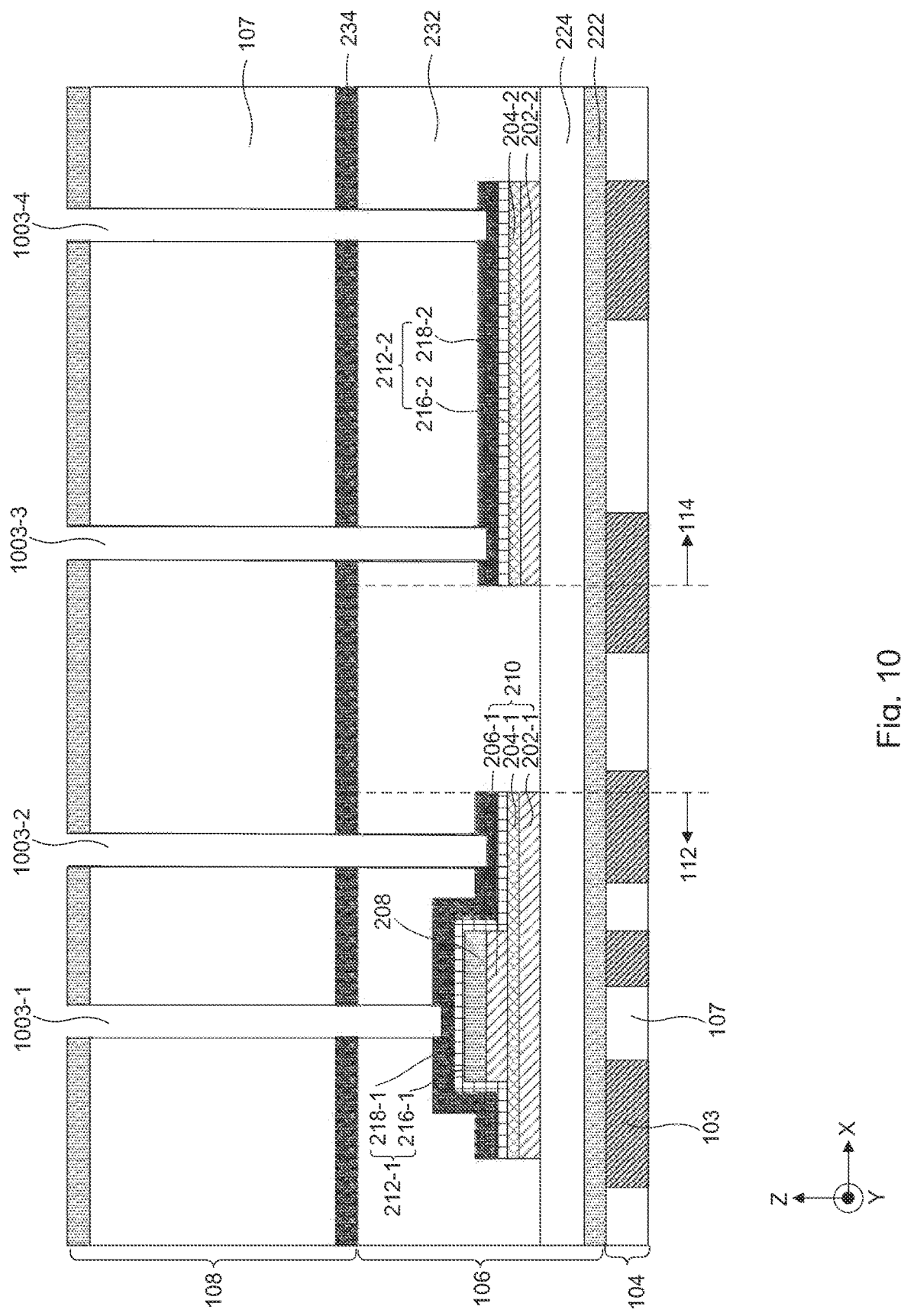

The formation of top mask layer 936 can be followed by the formation of openings 1003-1, 1003-2, 1003-3, and 1003-4, as shown in FIG. 10. In some embodiments, a dry etching process can etch through top mask layer 936, intermetallic dielectric layers 107, hard mask layer 234, and second insulating layer 232. In some embodiments, the dry etching process can be directional and can include multiple etching operations. The dry etching process can use etchants including $C_4F_6$, $Cl_2$, and $O_2$. Second capping layers 218-1 and 218-2 can act as the etch stop point of the dry etching process.

Figure 11:
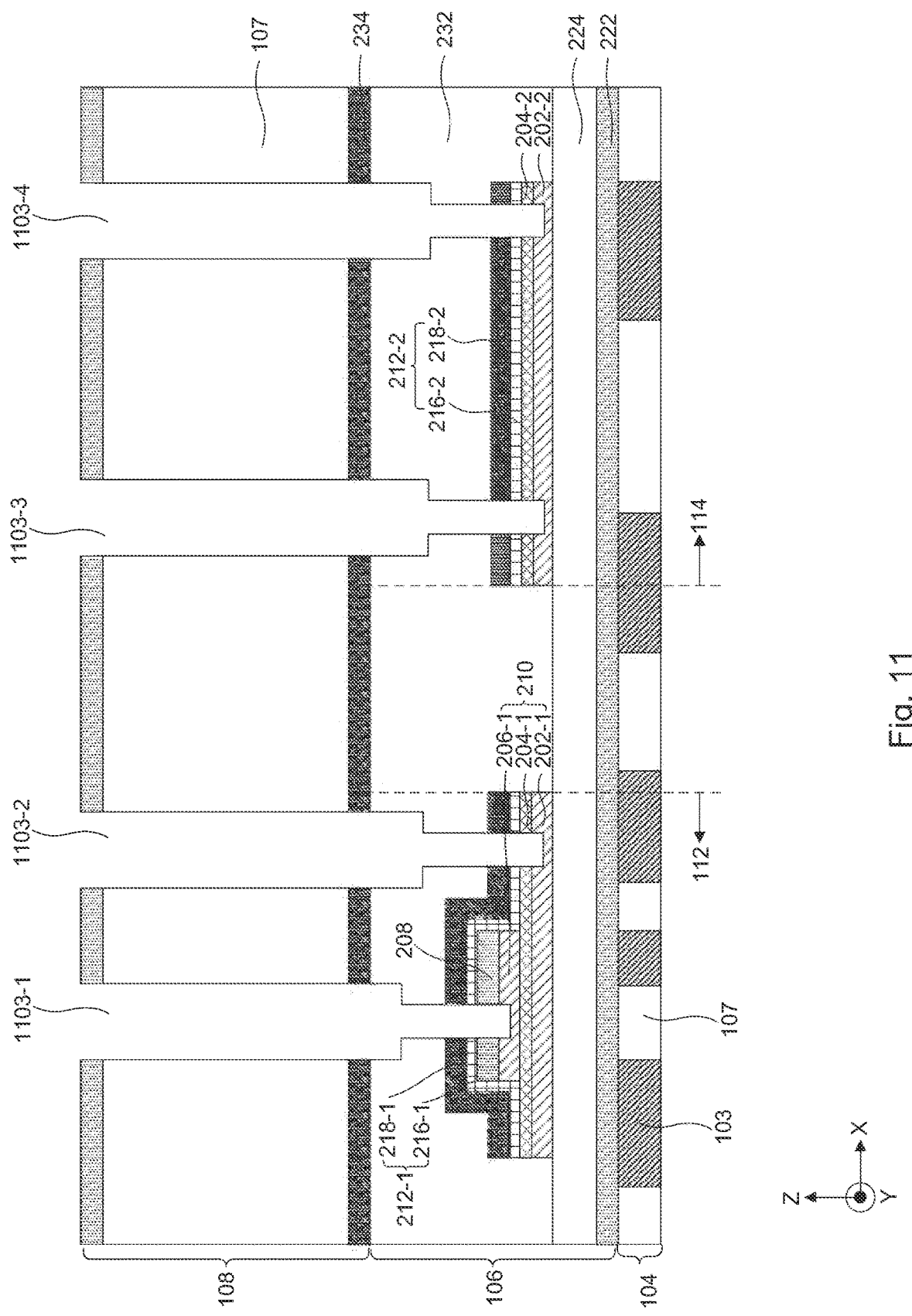

The formation of openings 1003-1, 1003-2, 1003-3, and 1003-4 can be followed by the formation of openings 1103-1, 1103-2, 1103-3, and 1103-4, as shown in FIG. 11. In some embodiments, an additional dry etching process can etch through second capping sublayers 218-1 and 218-2, first capping sublayers 216-1 and 216-2, high-k dielectric layers 204-1 and 204-2, and protect layer 208. In some embodiments, the dry etching process can be directional and can include multiple etching operations. The additional etching process can stop on first capacitor plate 202-1, second capacitor plate 206-1, and resistor structure 202-2. Openings 1103-1, 1103-2, 1103-3, and 1103-4 can expose first capacitor plate 202-1, second capacitor plate 206-1, and resistor structure 202-2 for subsequent conductive material deposition thereon. In some embodiments, openings 1103-1, 1103-2, 1103-3, and 1103-4 can extend into first capacitor plate 202-1, second capacitor plate 206-1, and resistor structure 202-2 to ensure a reliable low resistance electrical contact for subsequent conduct material deposition. In some embodiments, the additional dry etching process can increase the dimensions of openings 1103-1, 1103-2, 1103-3, and 1103-4, as shown in FIG. 11.

The formation of openings 1103-1, 1103-2, 1103-3, and 1103-4 can be followed by deposition of conductive materials in openings 1103-1, 1103-2, 1103-3, and 1103-4 and a chemical mechanical polishing (CMP) process to co-planarize top surfaces of intermetallic dielectric layers 107 and interconnect structures 203-1, 203-2, 203-3, and 203-4, as shown in FIG. 2A. In some embodiments, interconnect structures 203-1, 203-2, 203-3, and 203-4 can be portions of second interconnect structure 108. In some embodiments, MIM capacitor structure 210 and resistor structure 202-2 can be formed with a single mask process on BEOL device layer 106. As a result, the number of mask processes to form resistor structure 202-2 and MIM capacitor structure 210 can be reduced and the parasitic capacitances generated by resistor structure 202-2 can be reduced. In some embodiments, as shown in FIGS. 2B-2F, one or more layers of high-k dielectric layer 204-2, first capping sublayer 216-2, and second capping sublayer 218-2 can be omitted by blocking second mask area 114 during the deposition of the corresponding layers.

Various embodiments in accordance with this disclosure provide methods of forming semiconductor structure 100 having resistor structure 202-2 and MIM capacitor structure 210 with a single mask process. In some embodiments, semiconductor structure 100 can include first interconnect structure 104 on substrate 102, first insulating layer 224 on first interconnect structure 104, and resistor structure 202-2 and MIM capacitor structure 210 on first insulating layer 224. In some embodiments, resistor structure 202-2 and MIM capacitor structure 210 can be in contact with first insulating layer 224 and separated by second insulating layer 232. First interconnect structure 104 can be a BEOL interconnect structure connected to one or more active devices (e.g., transistors) in a FEOL device layer on substrate 102. In some embodiments, resistor structure 202-2 and MIM capacitor structure 210 can be formed on BEOL device layer 106 by a single mask process. The single mask process can reduce the number of mask processes to form the resistor and MIM capacitor structures and reduce the parasitic capacitances generated by the resistor structure.

In some embodiments, a semiconductor structure includes an interconnect structure on a substrate, a first insulating layer on the interconnect structure, first and second conductive plates on the first insulating layer and separated by a second insulating layer, a dielectric layer on the first conductive plate, and a third conductive plate on the dielectric layer. Bottom surfaces of the first and second conductive plates are coplanar.

In some embodiments, a system includes an interconnect structure on a substrate, a first insulating layer on the interconnect structure, a resistor structure in contact with the first insulating layer, a capacitor structure in contact with the first insulating layer, and a second insulating layer between the resistor structure and the capacitor structure. The capacitor structure includes first and second plates and a dielectric layer between the first and second plates.

In some embodiments, a method includes forming an interconnect structure on a substrate, forming a first insulating layer on the interconnect structure, forming a first conductive layer on the first insulating layer, forming a dielectric layer on the first conductive layer, forming a second conductive layer on the dielectric layer. The method further includes removing a portion of the second conductive layer and forming a second insulating layer between first and second portions of the first conductive layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an interconnect structure on a substrate;
   a first insulating layer on the interconnect structure;
   first and second conductive plates on the first insulating layer and separated by a second insulating layer, wherein bottom surfaces of the first and second conductive plates are coplanar;
   a dielectric layer on the first conductive plate;
   a third conductive plate on the dielectric layer; and
   a capping structure on the third conductive plate.

2. The semiconductor structure of claim 1, further comprising a first interconnect structure connected to the first conductive plate and a second interconnect structure connected to the second conductive plate.

3. The semiconductor structure of claim 1, wherein the capping structure is on the second conductive plate.

4. The semiconductor structure of claim 3, further comprising a mask layer between the capping structure and the second conductive plate.

5. The semiconductor structure of claim 3, wherein the capping structure comprises a layer of silicon oxide and a layer of silicon nitride.

6. The semiconductor structure of claim 1, further comprising first and second interconnect structures connected to the second conductive plate.

7. The semiconductor structure of claim 1, wherein the dielectric layer is on the second conductive plate.

8. The semiconductor structure of claim 1, wherein the first and third conductive plates comprise titanium nitride.

9. The semiconductor structure of claim 1, wherein a thickness of the second conductive plate is greater than a thickness of the first conductive plate.

10. A system, comprising:
    an interconnect structure on a substrate;
    a first insulating layer on the interconnect structure;
    a resistor structure in contact with the first insulating layer;
    a capacitor structure in contact with the first insulating layer, wherein the capacitor structure comprises first and second electrodes and a dielectric layer between the first and second electrodes;
    a second insulating layer between the resistor structure and the capacitor structure;
    a first interconnect structure connected to the second electrode; and
    a second interconnect structure extending through the dielectric layer and connected to the first electrode.

11. The system of claim 10, further comprising:
    third and fourth interconnect structures connected to the resistor structure.

12. The system of claim 10, further comprising:
    a first capping structure on the resistor structure; and
    a second capping structure on the capacitor structure.

13. The system of claim 12, wherein each of the first and the second capping structures comprises a layer of silicon oxide and a layer of silicon nitride.

14. The system of claim 12, wherein the dielectric layer is further disposed on the resistor structure.

15. The system of claim 12, wherein a thickness of a thickness of the resistor structure is greater than a thickness of the first electrode of the capacitor structure.

16. A method, comprising:
    forming an interconnect structure on a substrate;
    forming a first insulating layer on the interconnect structure;
    forming a first conductive layer on the first insulating layer;
    forming a dielectric layer on the first conductive layer;
    forming a second conductive layer on the dielectric layer;
    removing the second conductive layer over a first portion of the first conductive layer; and
    replacing a portion of the first conductive layer and the dielectric layer with a second insulating layer between the first portion and a second portion of the first conductive layer, wherein the dielectric layer remains on the first and second portions of the first conductive layer.

17. The method of claim 16, further comprising:
- forming first and second interconnect structures connected to the second conductive layer and the first portion of the first conductive layer; and
- forming third and fourth interconnect structures connected to the second portion of the first conductive layer.

18. The method of claim 17, wherein forming the first, second, third, and fourth interconnect structures comprises:
- forming first, second, third, and fourth openings in the second insulating layer to expose the first and second conductive layers; and
- filling the first, second, third, and fourth openings with a conductive material in a single deposition process.

19. The method of claim 16, further comprising forming a capping structure on the first conductive layer.

20. The method of claim 16, wherein replacing the portion of the first conductive layer and the dielectric layer with the second insulating layer comprises:
- removing the portion of the dielectric layer and the first conductive layer to form an opening between the first and second portions of the first conductive layer; and
- filling the opening with the second insulating layer.

* * * * *